United States Patent [19]
Carroll et al.

[11] Patent Number: 5,287,035
[45] Date of Patent: Feb. 15, 1994

[54] SAW DETECTOR

[75] Inventors: Roger D. Carroll, Willimantic; Sears W. Merritt, Glastonbury, both of Conn.

[73] Assignee: United Technologies Corporation, Hartford, Conn.

[21] Appl. No.: 955,955

[22] Filed: Oct. 5, 1992

[51] Int. Cl.⁵ .............................. H01L 41/08
[52] U.S. Cl. ..................... 310/313 R; 310/313 A; 257/415
[58] Field of Search ........... 310/313 R, 313 A, 313 B, 310/313 D; 333/150–154, 194, 195; 357/24 R, 24 M, 26

[56] References Cited

U.S. PATENT DOCUMENTS

| | | | |
|---|---|---|---|
| 3,868,595 | 2/1975 | Capps, Jr. et al. | 331/108 |
| 4,600,853 | 7/1986 | Whitlock et al. | 310/313 B |
| 4,749,964 | 6/1988 | Ash | 331/107 |
| 4,884,001 | 11/1989 | Sacks et al. | 310/313 A |
| 4,893,161 | 1/1990 | Tanski et al. | 357/24 |
| 4,926,083 | 5/1990 | Merritt et al. | 310/313 R |
| 4,980,596 | 12/1990 | Sacks et al. | 310/313 D |
| 4,990,814 | 2/1991 | Tanski et al. | 310/313 R |
| 5,034,793 | 7/1991 | Malocha et al. | 357/26 |
| 5,128,579 | 7/1992 | Carroll et al. | 310/313 B |
| 5,128,734 | 7/1992 | Cullen et al. | 310/313 R X |
| 5,144,262 | 9/1992 | Hunsinger | 310/313 D X |
| 5,159,299 | 10/1992 | Cullen et al. | 310/313 R X |

Primary Examiner—Mark O. Budd
Attorney, Agent, or Firm—Gerald L. Depardo

[57] ABSTRACT

A SAW detector has a SAW transducer 10 disposed on the surface of a piezoelectric substrate 12 which injects a SAW 20 in response to an RF input signal applied to line 14. A semiconductor charge transport region 30 comprising a charge transport channel 32 sandwiched between two charge confinement layers 34,36, is disposed above the substrate. A source electrode 40 provides electrons to the channel 32 and a drain electrode 42 removes electrons from the channel 32. The electric fields generated by the SAW 20 travel along the channel 32 and provide a forcing function to move the electrons from the source electrode to the drain electrode as a continuum, not in charge packets, thereby providing output current 48 on a line 49 indicative of the SAW 20 frequency.

11 Claims, 2 Drawing Sheets

SAW DETECTOR

DESCRIPTION

1. Technical Field

This invention relates to Surface Acoustic Wave (SAW) devices and more particularly to a SAW device made from a semiconductor that provides SAW detection.

2. Background Art

It is known that a surface acoustic wave (SAW) is generally excited by an inter-digital transducer comprising two sets of interleaved metal electrodes called fingers disposed on the surface of a piezoelectric substrate. To generate a SAW, an AC (or RF) potential is applied between adjacent sets of fingers which are spaced a distance of one-half of the desired SAW wavelength. A SAW transducer is a "reciprocal" device and hence a transducer that excites or injects a SAW will also detect a SAW.

Also, it is known in the art of SAW devices to design SAW filters comprising: a piezoelectric substrate; a first SAW transducer, employed as a SAW injector, disposed on the piezoelectric substrate, having a configuration designed to respond to a predetermined AC input frequency and generate a SAW at a predetermined wavelength; and a second SAW transducer, employed as a SAW detector, disposed on the piezoelectric substrate down-stream from where the SAW was injected, which detects the SAW injected by the first transducer.

It is also known that SAW devices are excellent for stand-alone bandpass filters, delay lines, or other filter devices. SAW devices provide significant stopband rejection with flat response in the stopband and provide linear phase characteristics. Further, it is known that a wide variety of SAW filter frequency response characteristics may be obtained quite readily by merely adjusting the spacing of the fingers of either the input (injecting) and/or output (detecting; or pick-up) SAW transducer.

For use of a SAW device as a pure delay line within a larger filter circuit, see U.S. Pat. No. 4,749,964, entitled "Superregenerative Detector Having a SAW Device in the Feedback Circuit", to Ash, and U.S. Pat. No. 3,868,595, entitled "RF Oscillator Frequency Control Utilizing Surface Wave Delay Lines", to Capps Jr. et al.

Typically an electrical input signal is applied to the input SAW transducer to inject the input signal and an electrical output signal indicative of the SAW is sensed from the output transducer. Thus, all SAW devices require some form of interdigital output SAW transducer to detect the SAW wave (i.e., the output wave, or SAW output).

The output SAW transducer takes up space on the surface of the device, requires precise fabrication, is an additional step in the fabrication process, and adds to signal loss in the system. Also, the output SAW transducer produces distortions due to energy reflected from the transducer commonly referred to as "triple transit echo". Further, the output signal from an output SAW transducer typically exhibits signal distortions resulting from the detection of bulk SAW modes which are always generated to some degree by inter-digital transducers. Therefore, it would be desirable to have a SAW detection device that provides an electronic output signal indicative of the SAW signal directly without the need for an output SAW transducer.

DISCLOSURE OF INVENTION

Objects of the invention include provision of a SAW detection device that does not require an output SAW transducer.

According to the present invention a Surface Acoustic Wave (SAW) is injected into a piezoelectric substrate by a SAW transducer which is excited by an AC input voltage A semiconductor charge transport region comprising a charge transport channel sandwiched between two charge confinement layers and disposed near the piezoelectric substrate. A first ohmic contact (or source electrode) is placed at one end of the charge transport region on the surface near the SAW transducer and acts as an electron source. An second ohmic contact (or drain electrode) is placed at an opposite end of the charge transport region and acts as an electron drain. The SAW propagates throughout the device and generates electric fields which cause mobile charge carriers to move from the source electrode, along the charge transport channel, to the drain electrode in a continuous fashion, i.e., not in charge packets. Characteristics of the SAW are detected by measuring the current flowing from the drain electrode, thereby providing an output signal indicative of the SAW.

Present invention provides a DC electronic output related to the magnitude of the SAW generated by the input SAW transducer at a given frequency. Thus, the invention may be used as an amplitude modulation signal demodulator, if the SAW transducer filter design is designed to provide a frequency response having a peak frequency at the AM frequency desired. Also, the invention may be used as a frequency modulation (FM) signal demodulator, if the SAW transducer is designed to have a frequency response that varies in any known way to frequency e.g., a known linear slope.

Further, the system may be used as a filter to detect only a given input frequency by setting the SAW transducer design to have a narrow frequency response. Similarly, the invention may be used as a SAW transducer design tool because the output signal is indicative of the frequency response of the SAW transducer, thereby providing an easy way to design and test-out a given SAW transducer configuration for its frequency response characteristics.

Because the invention uses only one SAW transducer instead of a pair of transducers used in conventional SAW filters, it does not suffer from distortions due to "triple transit echo" (discussed hereinbefore) energy reflected from the second transducer. Also, the invention does not exhibit distortions present in conventional SAW filters resulting from the detection of bulk SAW modes generated by inter-digital transducers.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Referring to FIG. 11, a SAW transducer 10 is disposed on an upper surface of a piezoelectric semi-conductor substrate 12, e.g., gallium arsenide (GaAs). An electrical input signal is applied to one side of the SAW transducer 10 on a line 14 from an antenna 16, and the other side of the SAW transducer 10 in grounded through a line 15. Other methods of receiving the input signal to the transducer 10 may be used if desired.

The SAW transducer 10, as is known, accepts an electrical input signal and converts the electrical signal to a Surface Acoustic Wave (SAW) 20 within the substrate 12. The SAW transducer 10 comprises a typical design such as that used in Acoustic Charge Transport (ACT) devices and Heterojunction Acoustic Charge Transport (HACT) devices, such as that described in U.S. Pat. No. 4,893,161 to Tanski et al., entitled "Quantum Well Acoustic Charge Transport Device" and U.S. Pat. No. 5,128,579 to Carroll et al., entitled "ACT Electrode Configuration for Linear Readout", and is discussed in more detail hereinafter.

Figure 1:
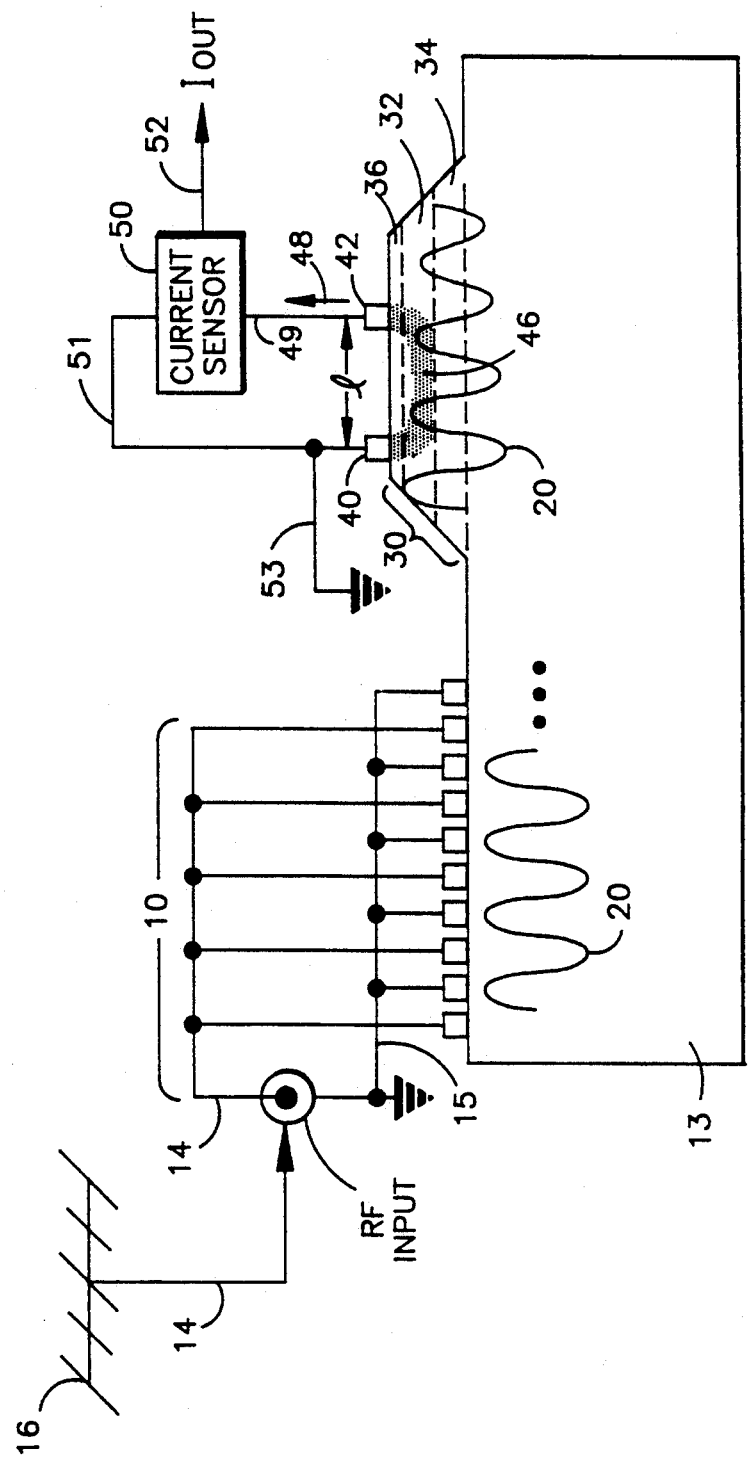
FIG. 1 is a side view of a SAW detector showing a SAW transducer, a SAW, and charge transport region, in accordance with the present invention.
Figure 2:
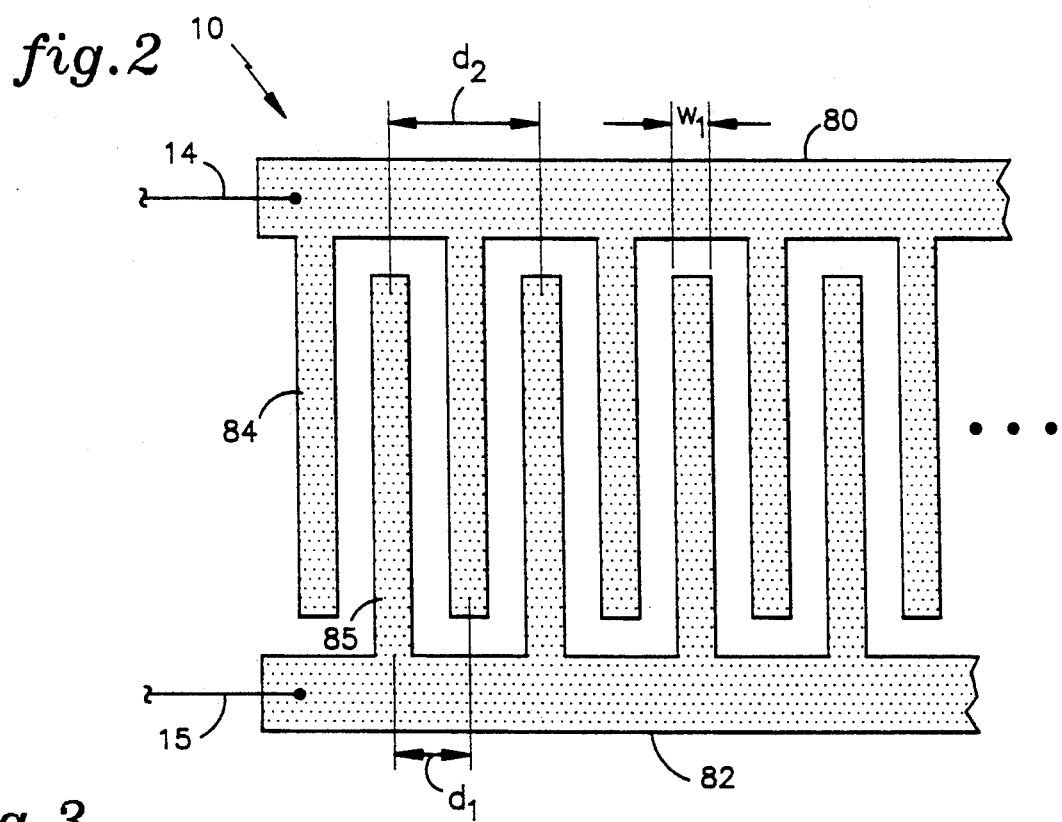
FIG. 2 is a top view of a SAW transducer used to inject a SAW into a piezoelectric substrate, in accordance with the present invention.

In FIG. 1, the electrode array for the SAW transducer 10 is shown for illustrative purposes as being connected by wires that are not touching the surface of the substrate. However, it should be understood that each group of electrodes (or fingers) are connected together by a bus bar (or pad) which is disposed on the same surface of the substrate as the electrodes, as is shown in FIG. 2 (discussed hereinafter).

Grown above the substrate 12 is a semiconductor charge transport region 30 comprising a charge transport layer (or channel) 32 sandwiched between a lower charge confinement layer 34 and an upper charge confinement layer 36. The charge transport channel 32 is made from GaAs and has a thickness of about 400 Å and is not intentionally doped (NID). The upper charge confinement layer 36 is made from N doped Aluminum Gallium Arsenide (AlGaAs) having a thickness of about 700 Å, an Al concentration of about 32%, and an N dopant concentration of about $2 \times 10^{17}/cm^3$ which satisfies surface states and provides electron conductivity for electrons to pass into the channel. The lower charge confinement layer 34 is about 1100 Å thick, and is made from NID AlGaAs having an Al concentration of about 32%. The lower charge confinement layer may be doped if desired. Other thicknesses and concentrations may be used for each of the layers if desired. The charge confinement layers 34,36 provide for charge confinement in the vertical direction.

Above the upper charge confinement layer 36 is a cap layer (not shown) made of GaAs which provides a protective coating to prevent the AlGaAs layer 36 from oxidizing, as is known, and provides a good contact surface for the electrodes to be attached. An epitaxial structure similar to that described above is described in the aforementioned Tanski patent.

Disposed on the upper surface of the charge transport region 30, on the end nearest the SAW transducer 10, is an ohmic contact 40 (source electrode), made of a plurality of metal layers, e.g., nickel-germanium-gold-titanium, similar to that used in HACT devices, which is heavily doped for providing a reservoir of available free-flowing electrons into the channel 32. On the opposite end of the charge transport region 30, disposed on the surface thereof, is a second ohmic contact used as an electron drain 42 which serves to drain electrons from the charge transport channel 32.

As the SAW 20 propagates through the substrate, electric fields generated by the SAW 20 propagate through the charge transport region 30. The electric fields generated by the SAW in the charge transport region 30 cause electrons to be attracted from the heavily doped ohmic contact 40. As the SAW 20 propagates along the charge transport region 30, electrons 46 in the channel 32 propagate along the channel due to the electric fields generated by the SAW 20 and are extracted from the channel by the ohmic contact 42 (or drain electrode). The direction of the electron flow is indicated by an arrow 48. It should be understood that a continuous path of electrons 46 are always present within the channel 32 even when the SAW 20 is not propagating and thus the electrons are not moving.

The electron flow from the drain electrode 42 travels in the direction 48 on a line 49 to a current sensor 50, e.g., a current meter, or a resistor and an volt-meter used to measure the voltage across the resistor, and then back to the source electrode 40 on a line 51, thereby completing a current loop. The current sensor provides an output signal on a line 52 indicative of the current flowing on the line 49. Other means of measuring the current exiting the drain electrode may be used if desired. It should be understood that the current sensor 50 may be located anywhere in the current loop. The loop is grounded near the source electrode 40 by a line 53 to reduce noise and providea a reference plane. Similarly, both electrodes may be connected independantly to ground or through other circuits and then to ground.

To ensure proper detection of the SAW, to provide minimum response time of the output current to the SAW frequency, and to minimize signal attenuation due to SAW damping effects along the channel, the distance 1 between the electrodes 40,42 should be kept small, e.g., 20 microns. Other distances may be used if desired.

The invention should not be confused with Acoustic Charge Transport (ACT) devices or Heterojunction Acoustic Charge Transport (HACT) devices. In ACT or HACT devices the SAW potentials are sufficiently strong enough to transport electrons in isolated potential wells (charge packets) at the speed of sound in the device, as is known. Thus, ACT and HACT devices are effectively sampled analog devices with a sampling rate equal to the SAW velocity.

However, in the present invention, the SAW potentials apply a bias in the direction of propagation strong enough to cause the stream of electrons 46 to propagate but not so strong as to break the electrons into packets, as occurs in ACT devices. Consequently, an electron continuum 46 exists between the ohmic contacts 40,42; thus, current flows at the speed of electron flow (related to the electric field strength and mobility of the charge carriers) between the ohmic contacts 40,42 as opposed to at the speed of sound (i.e., the SAW velocity) in an ACT device. Thus, no sampling of the input signal occurs in the invention, unlike an ACT device.

Further, the input signal to an HACT or ACT device is applied to a diode-like structure which modulates the number of electrons entering the charge transport channel. More specifically, a separate Schottky contact acts to control the number of electrons allowed into the channel and the electrical signal applied thereto represents the input signal. However, the AC (or RF) input signal of the invention is applied to the SAW transducer 10 on the line 14 (FIG. 1), unlike an ACT device.

Due to the high number of electrons in the charge transport channel 32 used in the invention and due to the SAW being less strong than that employed in an ACT or HACT device, the SAW wave is diminished (or damped-out) as it propagates along the channel 32, as evidenced by the damped sine wave of the SAW 20 shown in FIG. 1.

Referring now to FIG. 2, the SAW transducer has a first bank of electrodes 80 and a second bank of electrodes 82. The bank 80 has fingers 84 and the bank 82 has fingers 85. Adjacent electrodes 84,85 from opposite banks 80,82 are spaced a distance d1, e.g., one-half a SAW wavelength, and electrodes from the same bank are spaced a distance d2, e.g., one SAW wavelength. The bank 80 is excited by the RF input voltage signal on the line 14 (FIG. 1) and the bank 82 is connected to ground potential by the line 15.

The width w1 of the electrodes 84 is typically one-quarter wavelength, e.g., 6.5 microns, the total thickness (not shown) is 400 Å thick, comprising 100 Å of Titanium and 300 Å of Aluminum. Other widths, thicknesses, and materials may be used if desired.

Figure 3:
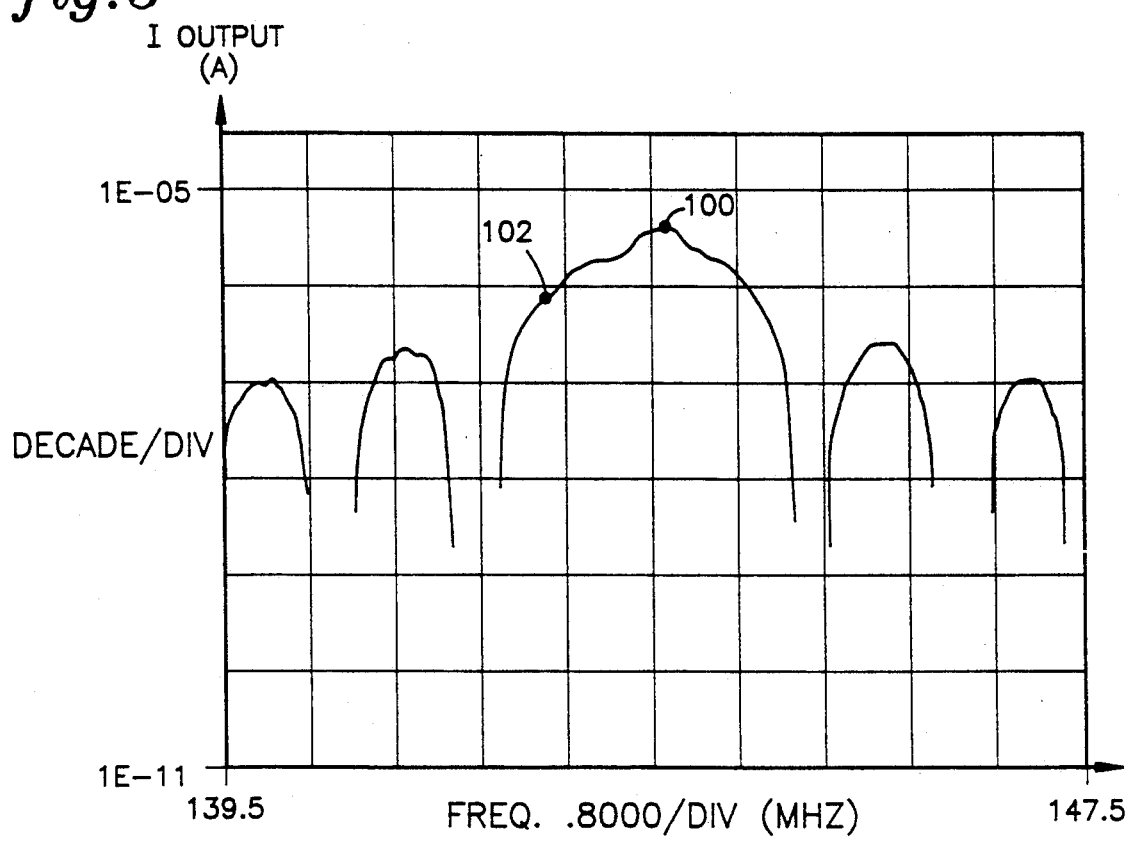
FIG. 3 is a frequency response plot showing output current from a drain electrode versus AC frequency input to a SAW transducer, in accordance with the present invention.

It is known in the design of SAW transducers and SAW filters that the SAW transducer may be designed to exhibit a wide range of frequency characteristics. The transducer shown in FIG. 2 has equal spacing of all the fingers and, thus, is designed to accept primarily one center frequency and will show lower levels of harmonics at other frequencies (FIG. 3). However, any frequency response desired may be derived from known design techniques of SAW transducers.

Referring now to FIG. 3, we have found that the amplitude of the output current $I_{out}$ from the electrode 42 is related to the frequency of the AC input signal on the line 14 (which is also the SAW frequency). The AC input signal applied on the line 14 was a constant-amplitude voltage signal applied at each frequency indicated. At a given input voltage frequency, the output current $I_{out}$ is a constant or dc value. Similarly, a variation in the AC input signal to the SAW transducer 10 (FIG. 1) causes a corresponding variation in the output current $I_{out}$. At a given input frequency, the SAW transducer converts the AC input signal into a SAW having an amplitude and frequency propagating in the substrate. The SAW 20 generates electric fields that cause the electrons 46 to flow from the source electrode 40 to the drain electrode 42. Consequently, the value of $I_{out}$ is indicative of the magnitude of the SAW generated by the SAW transducer 10 in response to the AC input signal applied thereto.

The SAW transducer 10 shown in FIGS. 1 and 2 has a known frequency response that resembles the sin(x)/x function (or "sinc" function; i.e., a curve having one main peak or center frequency at a point 100 and having symmetrically decreasing sidelobes on both sides of the peak). Accordingly, the plot of FIG. 3 shows a sinc function, the same as the frequency characteristic of the SAW transducer 10. Thus, the response of the system, i.e., AC input voltage to output current $I_{out}$ signal, is substantially the same as the frequency response characteristic of the SAW transducer.

Alternatively stated, the invention provides a dc output current or voltage signal indicative of the frequency of the AC input signal and characterized (or attenuated; or filtered) by the frequency response characteristics of the SAW transducer. Thus, the invention provides an electrical output signal indicative of the frequency response of the SAW transducer without the use of an output SAW transducer required by prior art SAW devices.

The device may be used for designing SAW transducers by placing a SAW Transducer configuration on the device and applying a frequency spectrum to the transducer and monitoring the output current. The output current will trace the frequency response of the SAW transducer.

Alternatively, the device may be used as an amplitude modulation (AM) signal demodulator, if the SAW transducer frequency response is designed as shown in FIG. 3, or equivalent. The frequency that will be accepted and provide maximum output signal response is indicated at the frequency at the point 100 on the graph of FIG. 3. If the signal is amplitude modulated with a carrier frequency at that point, the output current will be indicative of the amplitude modulation signal, i.e., the information carried by the carrier wave. Thus, the invention provides frequency filtering through the SAW filter and demodulation through the transport channel in a single device.

Also, the invention may be used as a frequency modulated (FM) signal demodulator. In that case, the frequency response characteristic is desired to change as the frequency changes, ideally in a linear fashion. For example, such a characteristic may exist around the point 102 in FIG. 3, however, a more linear characteristic may easily be obtained by choosing a different SAW transducer configuration. In the case of FM demodulation, the information is carried by the frequency of the input signal, thus, as the frequency changes, the output current changes in a known way.

Furthermore, the invention may be used as a frequency detector. As indicated by the frequency response of FIG. 3, the output current will be the highest level at a given frequency. In that case, the invention will provide a known output current level when a given frequency is present, thereby providing a very narrowband detector circuit.

As discussed hereinbefore, because this device uses only one SAW transducer instead of a pair of transducers used in conventional SAW filters, it does not suffer from distortions due to energy reflected from the output transducer commonly referred to as "triple transit echo". Also, as discussed hereinbefore, the invention does not exhibit distortions present in conventional SAW filters resulting from the detection of bulk SAW modes which are always generated to some degree by inter-digital transducers. Bulk mode detection in SAW filters typically results in distortions at frequencies above the center frequency of the device. Lack of this distortion is evident in FIG. 3, because the side lobes are not distorted at high frequencies.

Although the invention has been described as using a piezoelectric semi-conductor substrate with the charge transport region grown therefrom, it should be understood by those skilled in the art that the invention will work equally well with the substrate being made of a purely piezoelectric material, such as Lithium Niobate ($LiNbO_3$) and a charge transport region 30 attached or located near thereto, as discussed in U.S. Pat. No. 4,990,814 to Tanski et al., entitled "Separated Substrate Acoustic Charge Transport Device".

Also, it should be understood that instead of using electrons as the mobile charge carriers, holes may be used.

Instead of having both upper and lower charge confinement layers 34,36, the invention will also work with a charge transport region 30 having only a lower confinement layer 34. Such a device for transporting charge is disclosed in U.S. Pat. No. 5,128,734 to Cullen et al., entitled "Surface Channel HACT". In that case, the upper edge of the quantum well conduction band energy is provided by a surface potential as is known.

It should be understood that reduced ohmic contact resistances will increase the dynamic range of the invention because contact resistance limits the current flowing into the channel. This may be accomplished by increasing doping of the upper charge confinement layer or increasing the ohmic contact cross-sectional area.

Also, instead of using ohmic contact electrodes for injecting charge into and draining charge from the channel 32, any means for providing a resource for mobile charge carriers to be injected into the channel 32 and for removing charge from the channel 32 may be employed.

Furthermore, the invention will work equally well with an ACT-type configuration for charge confinement and SAW propagation. In that case, a bias voltage is applied via a pair of conductive surface plates disposed on the top and bottom surface, that biases a PN junction, to vertically confine the mobile charge carriers to a channel. Also, the charge transport channel is deeper from the surface than that used in HACT devices due to the potential at the surface.

Instead of using an interdigital transducer, the invention will work equally well with any device used to inject a SAW into a substrate having a frequency response characteristic. The output current $I_{out}$ will be indicative of the frequency response of that device.

Although the invention has been described and illustrated with respect to the exemplary embodiments thereof, it should be understood by those skilled in the art that the foregoing and various other changes, omissions and additions may be made without departing from the spirit and scope of the invention.

We claim:

1. A SAW detector, comprising:
    a piezoelectric substrate;
    SAW injection means, disposed on a surface of said substrate and having a frequency response characteristic, for injecting a SAW into said substrate;
    charge transport means, made of semiconductor material, disposed above said substrate, and having a charge transport channel therein, for transporting mobile charge carriers along said charge transport channel in a continuum at the speed of electron flow in response to electric fields generated by said SAW, and for confining said mobile charge carriers to said channel; and
    SAW detection means, for injecting said mobile charge carriers into said channel, for removing said mobile charge carriers from said channel, for detecting the flow of said mobile charge carriers through said channel, said flow of mobile charge carriers being indicative of a parameter of said SAW, and for providing a signal indicative of said frequency response characteristic of said SAW injection means.

2. The SAW detector of claim 1 wherein said SAW detection means comprises:
    charge injection means, disposed on a surface of said charge transport means, for injecting said mobile charge carriers into said channel in response to said electric fields generated by said SAW;
    charge drain means, disposed on said surface of said charge transport means, for removing said mobile charge carriers from said channel; and
    current detection means, disposed in a loop between said charge injection means and said charge drain means, for detecting the flow of said mobile charge carriers in said loop, said flow of mobile charge carriers being indicative of a parameter of said SAW, and for providing said output signal indicative of substantially said frequency response characteristic of said SAW injection means.

3. The SAW detector of claim 1 wherein the distance between said charge injection means and said charge drain means is set close enough to minimize the effects of SAW damping and to provide adequate SAW detection.

4. The SAW detector of claim 1 wherein said piezoelectric substrate is GaAs.

5. The SAW detector of claim 1 wherein said charge transport means comprises said charge transport channel sandwiched between an upper charge confinement layer and a lower charge confinement layer.

6. The SAW detector of claim 5 wherein said upper and lower charge confinement layers comprise AlGaAs.

7. The SAW detector of claim 1 wherein said charge transport channel comprises GaAs.

8. The SAW detector of claim 1 wherein said parameter of said SAW comprises SAW magnitude.

9. The SAW detector of claim 1 wherein said charge injection means comprises an ohmic contact electrode.

10. The SAW detector of claim 1 wherein said charge drain means comprises an ohmic contact electrode.

11. The SAW detector of claim 1 wherein said SAW injection means comprises an interdigital transducer.

* * * * *